United States Patent [19]
Lee et al.

[11] Patent Number: 5,594,262
[45] Date of Patent: Jan. 14, 1997

[54] ELEVATED TEMPERATURE GALLIUM ARSENIDE FIELD EFFECT TRANSISTOR WITH ALUMINUM ARSENIDE TO ALUMINUM GALLIUM ARSENIDE MOLE FRACTIONED BUFFER LAYER

[75] Inventors: Hyong Y. Lee, Beavercreek; Belinda Johnson, Dayton; Rocky Reston, Beavercreek, all of Ohio; Chris Ito, Colorado Springs, Colo.; Gerald Trombley, Centerville; Charles Havasy, Beavercreek, both of Ohio

[73] Assignee: The United States of America as represented by the Secretary of the Air Force, Washington, D.C.

[21] Appl. No.: 418,747

[22] Filed: Apr. 7, 1995

Related U.S. Application Data

[62] Division of Ser. No. 254,722, Jun. 6, 1994, Pat. No. 5,411,902.

[51] Int. Cl.$^6$ .................. H01L 31/0256; H01L 29/20
[52] U.S. Cl. ................. 257/192; 257/12; 257/183; 257/196
[58] Field of Search ................. 257/12, 20, 24, 257/27, 183, 192, 196

[56] References Cited

U.S. PATENT DOCUMENTS

| | | | |
|---|---|---|---|
| 4,918,493 | 4/1990 | Geissberger et al. | 357/4 |
| 4,952,527 | 8/1990 | Calawa et al. | 437/107 |
| 5,170,228 | 12/1992 | Sasaki | 257/184 |

FOREIGN PATENT DOCUMENTS

| | | | |
|---|---|---|---|
| 60-117677 | 6/1985 | Japan | 257/20 |
| 62-245680 | 10/1987 | Japan | 257/24 |
| 3-220731 | 9/1991 | Japan | 257/192 |
| 3-256338 | 11/1991 | Japan | 257/192 |

OTHER PUBLICATIONS

Greenberg et al., "A Pseudomorphic Al GaAsIn$^+$–InGaAs Metal–Insulator–Doped Channel FET for Broad–Band, Large–Signal Applications," IEEE Electronics Device Letters, vol. 12, No. 8, Aug. 1991, pp. 436–438.

Swirhon et al., "Refractory Self–Aligned–Gate GaAs FET Based Circuit Technology for High Ambient Temperature," Proceedings at First International High Temperature Electronics Conference, 1991, pp. 295–300.

Primary Examiner—Mahshid Saadat
Assistant Examiner—Alice W. Tang
Attorney, Agent, or Firm—Bernard E. Franz; Thomas L. Kundert; David E. Franklin

[57] ABSTRACT

The incorporation of an aluminum arsenide (AlAs) buffer layer in a gallium arsenide (GaAs) field effect transistor (FET) structure is found to improve the overall device performance, particularly in the high temperature operating regime. Similar characteristics may be obtained from devices fabricated with an $Al_xGa_{1-x}As$ $0.2 \leq x \leq 1$ barrier layer. At temperatures greater than 250° C., the semi-insulating gallium arsenide substrate begins to conduct significant amounts of current. The highly resistive AlAs buffer layer limits this increased conduction, thus permitting device operation at temperatures where parasitic leakage currents would impede or prevent device operation. Devices fabricated with AlAs buffer layers exhibited lower drain parasitic leakage currents and showed improved output conductance characteristics at 350° C. ambient temperature. The buffer layer will also improve the backgating problems which are detrimental to the operation of monolithic GaAs digital circuits having closely spaced devices under different bias conditions. An additional benefit of the high temperature capabilities of these devices is an improved reliability at conventional operating temperatures. Devices fabricated with this technology have shown an order of magnitude improvement in switching characteristics over known and published results.

12 Claims, 1 Drawing Sheet

ELEVATED TEMPERATURE GALLIUM
ARSENIDE FIELD EFFECT TRANSISTOR
WITH ALUMINUM ARSENIDE TO
ALUMINUM GALLIUM ARSENIDE MOLE
FRACTIONED BUFFER LAYER

RIGHTS OF THE GOVERNMENT

The invention described herein may be manufactured and used by or for the Government of the United States for all governmental purposes without the payment of any royalty.

This application is a division of our application Ser. No. 08/254,722 filed Jun. 6, 1994, now U.S. Pat. No. 5,411,902, issued May 2, 1995.

BACKGROUND OF THE INVENTION

The present invention relates generally to a gallium arsenide field effect transistor having an aluminum arsenide or an aluminum gallium arsenide barrier layer.

The following papers are of interest.

(1) S. Swirhun, S. Hanka, J. Nohava, D. Grider, and P. Bauhahn, "Refractory self-aligned-gate, GaAs FET based circuit technology for high ambient temperatures", Proceedings of First International High Temperature Electronics Conference, pp. 295–300, 1991.

(2) K. Fricke, H. L. Hartnagel, R. Schutz, G. Schweeger, and J. Wurfl, "A new GaAs technology for stable FET's at 300° C.", IEEE Electron Dev. Lett., vol. 10, no. 12, pp 577–579, 1989.

S. Swirhun et al at Honeywell have tested FETs fabricated with a self-aligned gate(SAG) process, using dopant implants, isolation implants, tungsten silicide (Wsi) Schottky gates, NiGeNilnNiMo ohmic metal contacts, and SiN passivation. For a 1.1×10 µm FET; a drain current on-to-off ratio of about 30:1 was obtained at 350° C. ambient temperature.

K. Fricke et al from West Germany have fabricated FETs grown by metal-organic chemical vapor deposition (MOCVD) using TiPtAu Schottky gates, GEAuNiWSiTiW-SiAu ohmic contacts, and SiN passivation. The Fricke device test results are difficult to interpret however, because the results are shown at an estimated temperature and not at the measured ambient temperature. In both the Swihurn and Fricke cases, however, the switching current ratios are inferior by at least an order of magnitude to FETs fabricated with an AlAs buffer layer as in the present invention.

The following United States patents are of interest.

| | |
|---|---|
| 4,980,325 | Berenz |
| 5,026,655 | Ohata |
| 4,952,527 | Calawa et al |
| 5,084,743 | Mishra et al |
| 5,049,951 | Goronkin et al |
| 4,916,498 | Berenz |
| 4,962,050 | Geissberger et al |
| 4,994,868 | Geissberger et al |
| 5,300,795 | Saunier et al |

SUMMARY OF THE INVENTION

An objective of the invention is to improve the overall device performance in a gallium arsenide (GaAs) field effect transistor (FET) structure, particularly performance in the high temperature operating regime.

According to the invention, the above objective is achieved by incorporation of an aluminum arsenide (AlAs) barrier layer in a selected cross sectional part of the transistor. Similar characteristics may also be obtained from devices fabricated with an $Al_xGa_{1-x}As$ ($0.2 \leq x \leq 1$) barrier layer.

At operating temperatures greater than 250° C., a normally semi-insulating gallium arsenide substrate begins to conduct significant amounts of current. A highly resistive AlAs barrier layer isolating this substrate however, limits this increased conduction, thus permitting device operation at temperatures where parasitic leakage currents would otherwise impede or prevent device operation. Devices fabricated with AlAs barrier layers also exhibit lower drain parasitic leakage currents and show improved output conductance characteristics at high operating temperatures such as a 350° C. ambient temperature. Such a barrier layer will also improve backgating problems which are detrimental to operation of monolithic GaAs digital circuits having closely spaced devices operated under different bias conditions. An additional benefit of the high temperature capabilities of these barrier layer devices is an improved reliability at conventional operating temperatures. Devices fabricated with this technology have also shown an order of magnitude improvement in switching characteristics over known and published results.

DETAILED DESCRIPTION

The incorporation of an $Al_xGa_{1-x}As$ ($0.2 \leq x \leq 1$) substrate isolating barrier layer in a gallium arsenide (GaAs) field effect transistor (FET) structure is found to improve the overall device performance, particularly in the high temperature operating regime. By way of explanation, it is believed well known in the semiconductor and transistor art that the $Al_xGa_{1-x}As$ ($0.2 \leq x \leq 1$) shorthand notation recited here defines a complementary range of mole fractions which may exist for the Aluminum and Gallium semiconductor material of the disclosed barrier layer. According to this notation for example a composition of the disclosed barrier layer may lie anywhere in the range from the Gallium-free two-element material Aluminum Arsenide, (for the case of x=1) to the primarily Gallium Arsenide with little Aluminum-included material which results when x has a value of 0.2.

At temperatures greater than 250° C., a normally semi-insulating gallium arsenide substrate begins to conduct significant amounts of current, current which is detrimental to operation of the field effect transistor. The $Al_xGa_{1-x}As$ barrier layer limits this increased substrate conduction, thus permitting device operation at temperatures where parasitic leakage currents would otherwise impede or prevent acceptable operation. Devices fabricated with AlAs barrier layers exhibit lower drain parasitic leakage currents and show improved output conductance characteristics at 350° C. and other elevated ambient temperatures. Similar characteristics are expected from devices fabricated with an $Al_xGa_{1-x}As$ ($0.2 \leq x \leq 1$) barrier layer. Such a barrier layer will also improve the backgating problems which are detrimental to the operation of monolithic GaAs digital circuits having closely spaced devices operated under different bias conditions. An additional benefit of the high temperature capabilities of these devices is an improved reliability at conventional operating temperatures.

Figure 1:
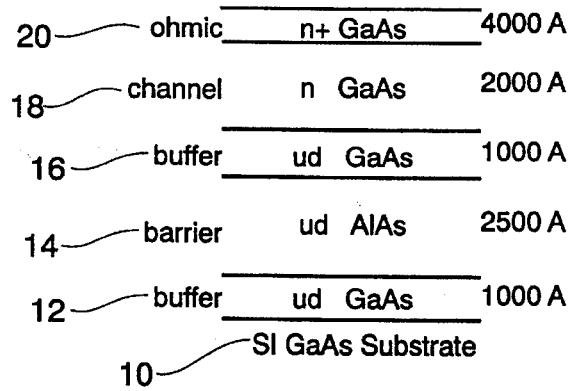
FIG. 1 is a diagram showing incorporation of an aluminum arsenide (AlAs) barrier layer in a gallium arsenide (GaAs) field effect transistor (FET) layer structure.

An example of a representative material structure grown by MBE (molecular beam epitaxy) is shown in FIG. 1. The FIG. 1 device is formed on a semi-insulating GaAs substrate 10, using a 1000 Å thick undoped GaAs buffer layer 12, a 2500 Å thick undoped AlAs barrier layer 14, a 1000 Å thick undoped GaAs buffer layer 16, a 2000 Å thick n type GaAs channel layer 18, and a 400 Å thick n+ type GaAs ohmic layer 20. The AlAs barrier layer 14 is grown at a temperature about 90° C. hotter than that for the GaAs layers to improve the quality of the AlAs layer and the subsequent layers. It is believed that this highly resistive AlAs layer electrically isolates the channel from the substrate, increasing the switching current ratio at high temperatures.

Figure 2:
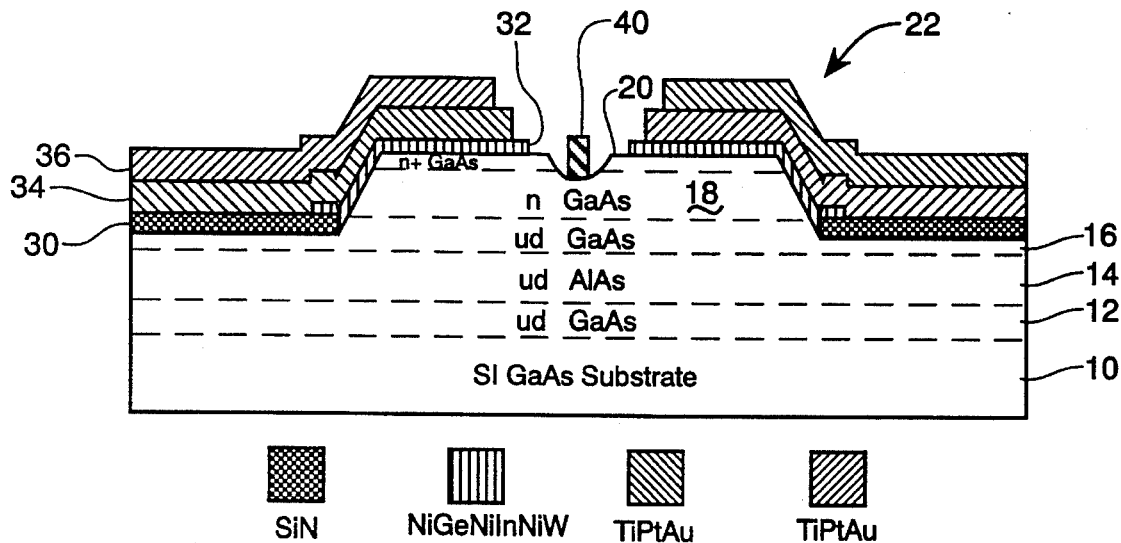
FIG. 2 is a diagram showing fabrication of a MESFET according to the invention.

As an example of a specific implementation of the invention, consider the fabrication of the MESFET shown in FIG. 2, starting with the device structure of FIG. 1. The first step in such fabrication is mesa definition using a light field mesa mask. The mesas 22 are isolated using a solution of HF:$H_2O_2$:$H_2O$ (1:1:8) as an etchant. Then, 1000 Å of Silicon Nitride (SiN) is deposited by plasma enhanced chemical vapor deposition (PECVD). This silicon nitride layer 30 is an additional isolation layer located adjacent the topside of the FIG. 2 transistor and serves to isolate the subsequent metal layers from the GaAs substrate 10. Next, the SiN covering the mesa is removed with a reactive ion etch (using an oxygen and FREON-14® $CF_4$ plasma) to facilitate the deposition of source, drain, and gate metals.

The ohmic source and drain metal 32 is patterned using a lift-off technique and consists of Ni, Ge, Ni, In, Ni, W layers of 50, 25, 50 50, 50, and 450 Å thickness, respectively. The NiGeNi layers are deposited by electron-beam evaporation, the InNi layers are deposited by thermal evaporation, and the W layer is deposited by RF magnetron sputtering. The ohmic contact of the drain metal 32 is rapid thermal annealed at 625° C. for 5 seconds in a gas which is 90% Ar and 10% $H_2$..These The achieved refractory ohmic contacts provide additional reliability at elevated temperatures.

Then, Ti, Pt, Au layers (of 300, 1000, and 3000 Å layer thickness respectively) and comprising interconnect metal 34 are electron-beam deposited. This metal layer structure interconnects the ohmic contact layer to the pads. Next layers of Ti, Pt, Au (300, 1000, and 4000 Å thick, respectively) metal 36 are deposited as the outtermost layer and gate metal to create a Schottky barrier in the channel. The gate region is recessed in a prior step using a solution consisting of $H_3PO_4$:$H_2O_2$:$H_2O$ (1:2: 1000) as etchant. The gate metal also improves the overall conductivity.

ADVANTAGES AND NEW FEATURES

Drain current switching ratios of 380:1 at 350° C. ambient temperature have been obtained for 1×200 μm MESFET fabricated using the structure shown in FIG. 1 along with the fabrication process described above. This is believed to be an order of magnitude improvement over the results obtained by S. Swirhun et al.

ALTERNATIVES

* An $Al_xGa_{1-x}As$ layer according to the invention may be incorporated into other FET structures.

* The material of the FET or other type of transistor may be obtained by ion implantation, or from any of the currently employed growth methods for materials, such as MBE, MOCVD, liquid phase epitaxy (LPE), etc.

* An InGaAlP layer may substitute for the described $Al_xGa_{1-x}As$ material layer as a barrier. In general such a substitute barrier layer may be comprised of $$In_{x_1}Ga_{x_2}Al_{1-x_1-x_2}As_{y_1}P_{1-y_1},$$

where $(0 \leq x \leq 1)$, $(0 \leq x \leq 1)$ and $(0 \leq y_1 \leq 1)$.

* The ohmic metal may use variations of Ni, Si, Ge, In, W, and Mo.

* The ohmic metal may also use variations of Ni, Ge, Au, Ni, (and Au).

* The Shottky gate may be fabricated from W, WN, TiWN, or WSi.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. A Gallium arsenide field effect transistor comprising:

a semi-insulating GaAs substrate member;

an undoped first GaAs buffer layer received on an exposed surface portion of said semi-insulating GaAs substrate member;

an undoped second GaAs buffer layer received over said undoped first GaAs buffer layer;

a n type GaAs channel layer received over said undoped second GaAs buffer layer;

a n+ type GaAs ohmic layer received on said n type GaAs channel layer;

means including an undoped homogeneous AlAs barrier layer disposed intermediate said undoped first and second GaAs buffer layers for limiting a flow of charge carriers between said semi-insulating GaAs substrate member and said n type GaAs channel layer during elevated temperature operation of said field effect transistor;

said undoped homogeneous barrier layer having a layer thickness greater than that of any other of said layers.

2. The field effect transistor of claim 1 wherein said undoped homogeneous barrier layer has a thickness of about 2500 Angstroms.

3. The field effect transistor of claim 2 wherein:

said undoped first GaAs buffer layer has a thickness of about 1000 Angstroms;

said undoped second GaAs buffer layer has a thickness of about 1000 Angstroms;

said n type GaAs channel layer has a thickness of about 2000 Angstroms; and said n+ type GaAs ohmic layer has a thickness of about 400 Angstroms.

4. The field effect transistor of claim 2 wherein said undoped homogeneous barrier layer of about 2500 Angstroms thickness is made by the process of growing said Aluminum Arsenide material at a temperature about ninety degrees Celsius hotter than the growth temperature of said undoped first GaAs buffer layer.

5. The field effect transistor of claim 2 further including a SiN isolation layer received over a portion of said undoped second GaAs buffer layer not covered by said n type GaAs channel layer.

6. The field effect transistor of claim 5 further including ohmic source and drain metal contacts comprising layers of Ni, Ge, Ni, In, Ni, and W of about 50, 25, 50, 50, 50, and 450 Angstroms thickness, respectively, received on separated portions of said n+ type GaAs ohmic layer.

7. The field effect transistor of claim 5 further including means comprising layers of Ti, Pt, and Au of 300, 1000, and 3000 Angstroms thickness, respectively, for creating a Schottky barrier gate member in a recessed exposed channel portion of said n type GaAs channel layer not covered by said n+ type GaAs ohmic layer or said ohmic source and drain metal contacts.

8. A field effect transistor comprising:

a semi-insulating GaAs substrate member;

a buffer layer received on an exposed surface portion of said semi-insulating GaAs substrate member;

a n type GaAs channel layer received over said buffer layer;

a n+ type GaAs ohmic layer received on said n type GaAs channel layer; and means including a homogeneous barrier layer comprised of Indium, Gallium and Phosphorous materials received on said undoped first buffer layer for limiting a flow of charge carriers between said semi-insulating GaAs substrate member and said n type GaAs channel layer during elevated temperature operation of said field effect transistor.

9. The field effect transistor of claim 8 wherein said homogeneous barrier layer further includes Aluminum material.

10. A field effect transistor comprising:

a semi-insulating GaAs substrate member;

a buffer layer received on an exposed surface portion of said semi-insulating GaAs substrate member;

a n type GaAs channel layer received over said buffer layer;

a n+ type GaAs ohmic layer received on said n type GaAs channel layer; and means including a homogeneous barrier layer comprised of Indium, Aluminum and Phosphorous materials received on said undoped first buffer layer for limiting a flow of charge carriers between said semi-insulating GaAs substrate member and said n type GaAs channel layer during elevated temperature operation of said field effect transistor.

11. The field effect transistor of claim 10 wherein said homogeneous barrier layer further includes Gallium material.

12. A GaAs field effect transistor comprising:

a semi-insulating GaAs substrate member having temperature-dependent electrical conductivity characteristics;

a Schottky gate-controlled charge carrier-conducting GaAs channel layer supported by said semi-insulating GaAs substrate member;

means, including an undoped homogeneous barrier layer comprised of Aluminum Arsenide material having a layer thickness greater than that of any other layer of said field effect transistor, disposed intermediate said semi-insulating GaAs substrate member and said Schottky gate-controlled charge carrier-conducting GaAs channel layer for limiting a flow of charge carriers between said semi-insulating GaAs substrate member and said Schottky gate-controlled charge carrier-conducting GaAs channel layer during elevated temperature operation of said field effect transistor.

* * * * *